(12) United States Patent  
Monachon et al.

(10) Patent No.: US 11,798,778 B2  
(45) Date of Patent: Oct. 24, 2023

(54) TIME-RESOLVED CATHODOLUMINESCENCE SAMPLE PROBING

(71) Applicant: ATTOLIGHT AG, Lausanne (CH)

(72) Inventors: Christian Monachon, Montreux (CH); Matthew John Davies, Wangen im Allgäu (DE); Fabrice Grondin, Longeray (FR)

(73) Assignee: ATTOLIGHT AG, Lausanne (CH)

( * ) Notice: Subject to any disclaimer, the term of this patent is extended or adjusted under 35 U.S.C. 154(b) by 0 days.

(21) Appl. No.: 17/379,815

(22) Filed: Jul. 19, 2021

(65) Prior Publication Data

US 2022/0020559 A1 Jan. 20, 2022

Related U.S. Application Data

(60) Provisional application No. 63/053,969, filed on Jul. 20, 2020.

(51) Int. Cl.
| | | |
|---|---|---|
| *H01J 37/22* | (2006.01) | |
| *H01J 37/28* | (2006.01) | |
| *H01J 37/04* | (2006.01) | |

(52) U.S. Cl.
CPC .......... *H01J 37/222* (2013.01); *H01J 37/045* (2013.01); *H01J 37/28* (2013.01); *H01J 2237/2808* (2013.01)

(58) Field of Classification Search
CPC .. H01J 37/00; H01J 37/02; H01J 37/22; H01J 37/222; H01J 37/26; H01J 37/28;
(Continued)

(56) References Cited

U.S. PATENT DOCUMENTS

| 5,393,976 A | 2/1995 | Koike |
| 9,767,986 B2 | 9/2017 | Brown et al. |

(Continued)

FOREIGN PATENT DOCUMENTS

| EP | 1672672 A2 | 6/2006 |
| TW | I660392 B | 5/2019 |

(Continued)

OTHER PUBLICATIONS

Chernyak, Leonid, et al. "Cathodoluminescence studies of the electron injection-induced effects in GaN", Appl. Phys. Lett. 82, 3680 (2003); https://doi.org/10.1063/1.1578514 Submitted: Feb. 6, 2003 . Accepted: Apr. 10, 2003 . Published Online: May 20, 2003 (4 pages).

(Continued)

*Primary Examiner* — Jason L McCormack
(74) *Attorney, Agent, or Firm* — WOMBLE BOND DICKINSON (US) LLP; Joseph Bach, Esq.

(57) ABSTRACT

Method for investigating samples by time-series emission of cathodoluminescence (CL) microscope having electron beam and light sensor. In discovery scan, changes caused by the electron beam are unknown, in an inspection scan changes have already been identified in similar sample. Discovery scan starts by setting parameters of the electron beam to irradiate at a first rate of dose; flushing the buffer of the light sensor; scanning the electron beam over an area of interest on the sample while collecting CL emission with the light sensor, while preventing any reading of the data from the buffer until the entire scanning has been completed; once the entire scanning has been completed, blanking the electron beam and interrogating the buffer to identify a first CL image; and then interrogating the buffer to fetch all remaining CL images and tagging all fetched CL images according to time sequence starting from the first CL image.

18 Claims, 4 Drawing Sheets

(58) Field of Classification Search
CPC ...... H01J 37/228; H01J 37/045; H01J 37/226; H01J 2237/2808
USPC .......................................... 250/306, 307, 311
See application file for complete search history.

(56) References Cited

U.S. PATENT DOCUMENTS

| | | |
|---|---|---|
| 11,508,547 B2 | 11/2022 | Wang et al. |
| 2007/0023655 A1* | 2/2007 | Nishikata .............. H01J 37/244 250/310 |
| 2009/0050802 A1* | 2/2009 | Noji ...................... H01J 37/265 250/307 |

FOREIGN PATENT DOCUMENTS

| | | |
|---|---|---|
| TW | 202001972 A | 1/2020 |
| WO | 2020225453 A2 | 11/2020 |

OTHER PUBLICATIONS

Gelhausen, O. et al. "Dissociation of H-related defect complexes in Mg-doped GaN", Physical Review B 69, 125210, Published: Mar. 17, 2004 (9 pages).
PCT International Search Report from related PCT Application No. PCT/IB2021/056561 dated Dec. 22, 2021, 19 pages.
PCT International Preliminary Report on Patentability from related PCT Application No. PCT/IB2021/056561, dated Feb. 2, 2023 (12 pages).

* cited by examiner

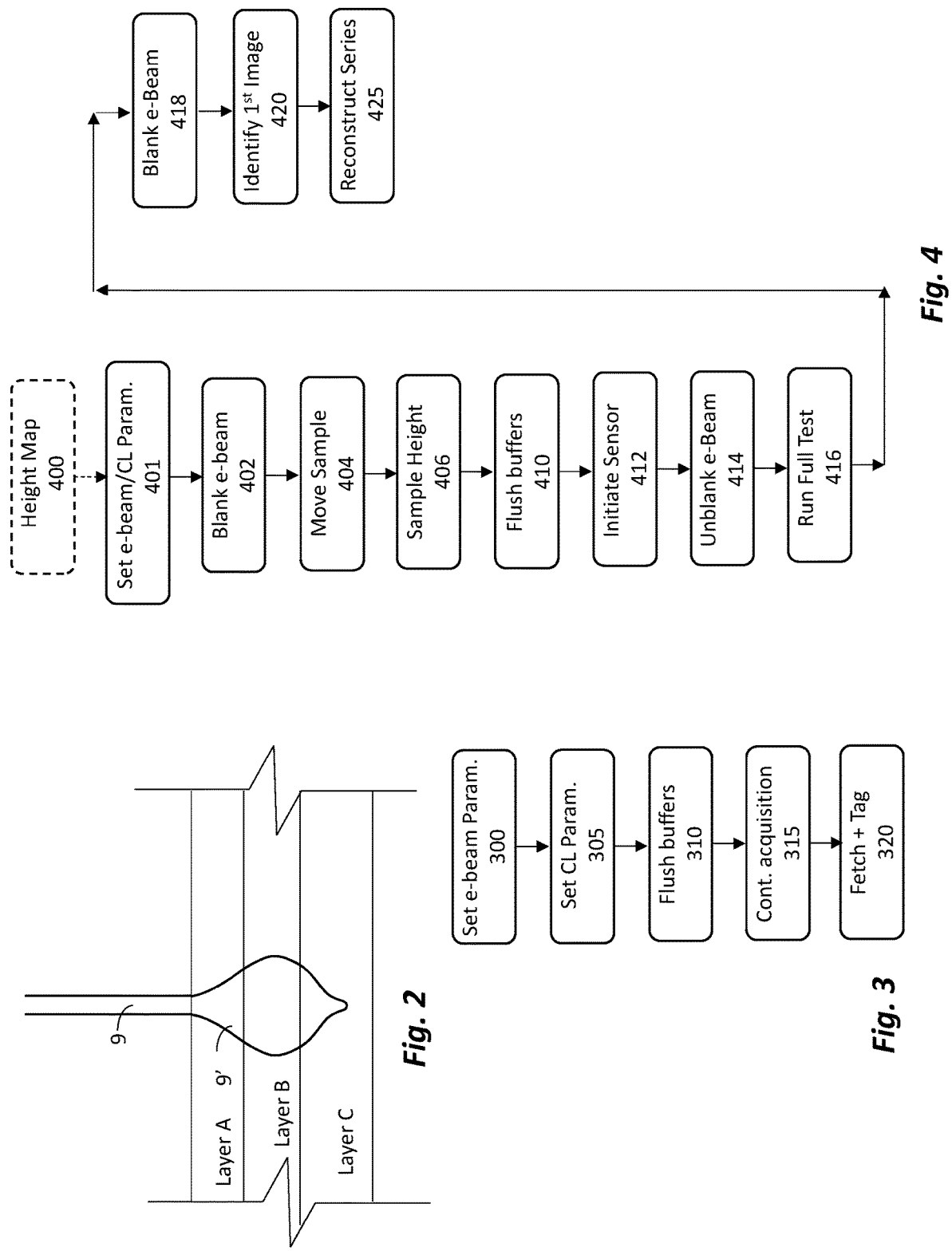

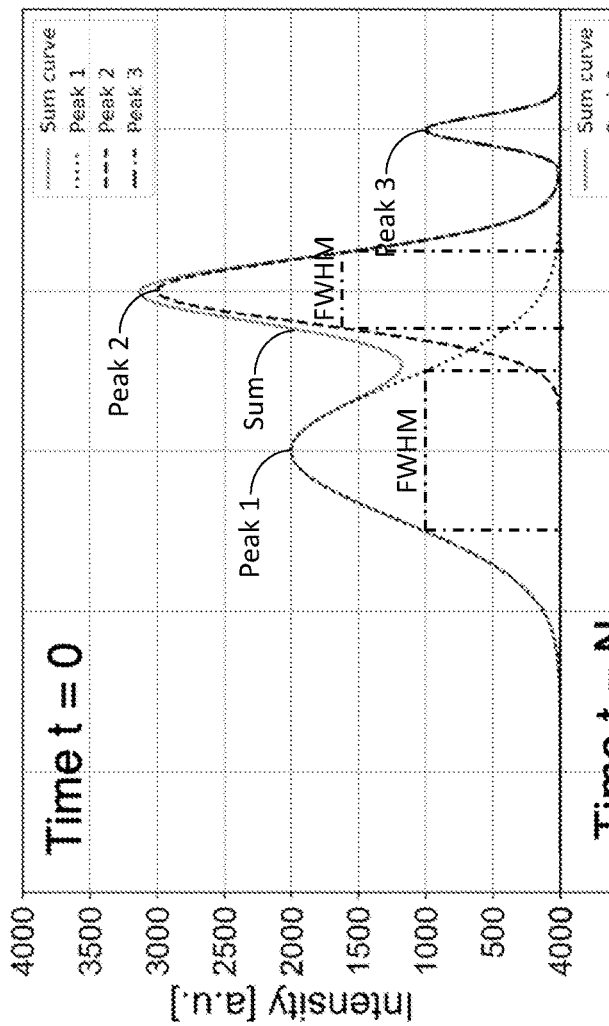
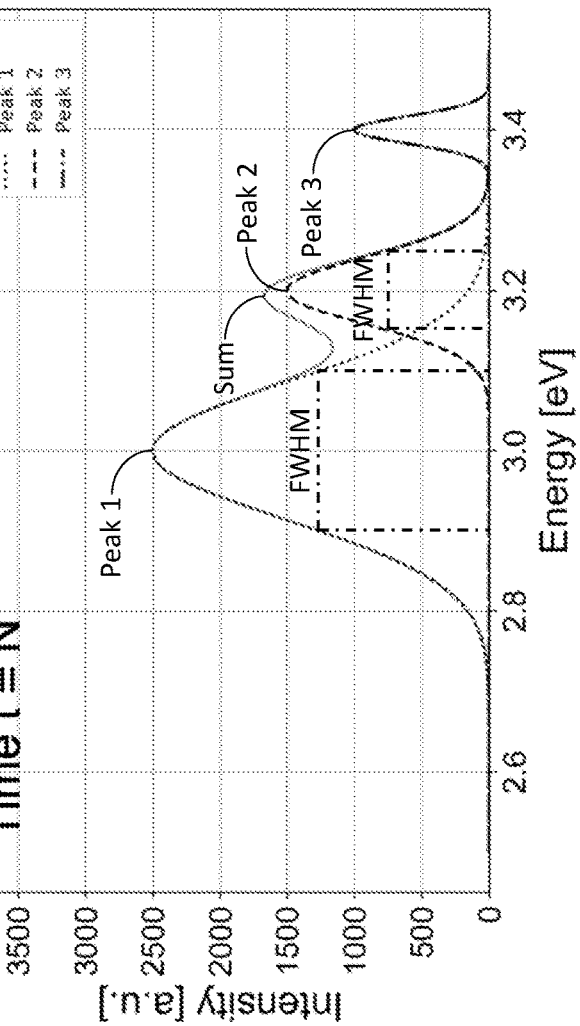
Fig. 5A
Fig. 5B

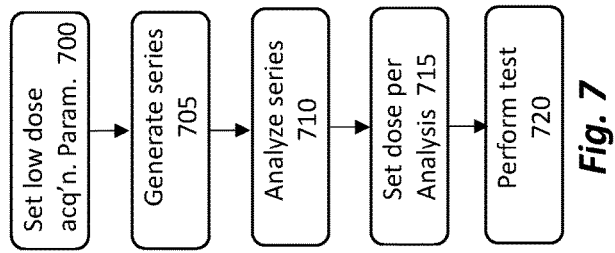
Fig. 7
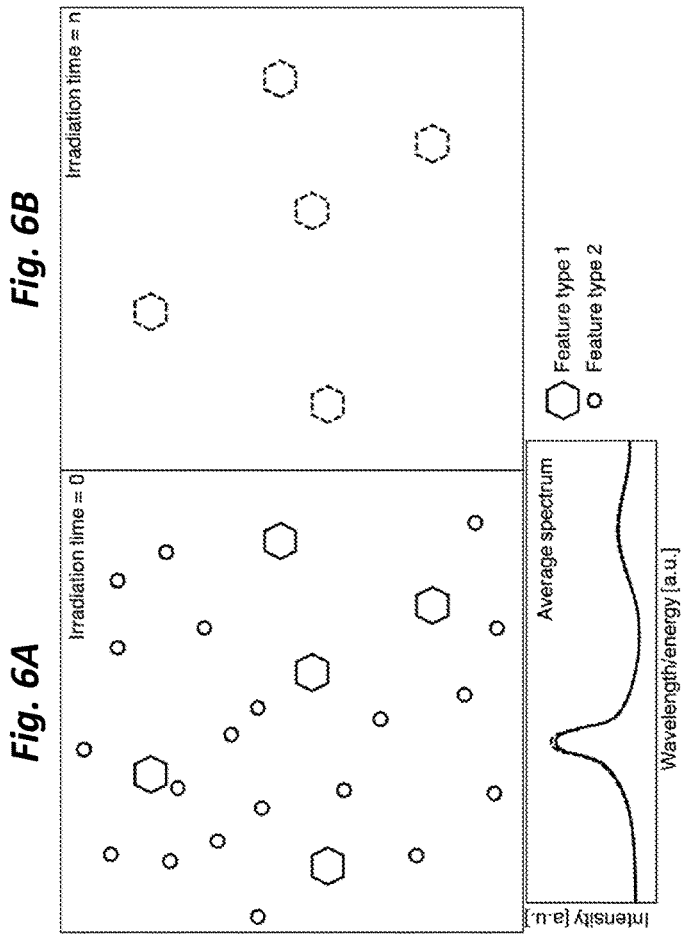
Fig. 6A
Fig. 6B
Fig. 6C
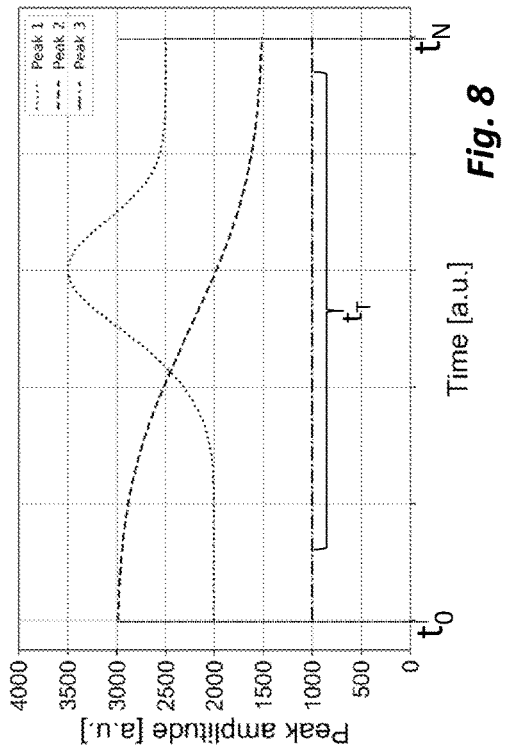
Fig. 8

TIME-RESOLVED CATHODOLUMINESCENCE SAMPLE PROBING

RELATED APPLICATIONS

This Application claims priority benefit from U.S. Provisional Application Ser. No. 63/053,969, filed Jul. 20, 2020, the disclosure of which is incorporated herein by reference in its entirety. This Application is also related to the subject matter disclosed in PCT Patent Application No. PCT/EP2020/063093, the disclosure of which is incorporated herein by reference in its entirety.

TECHNICAL FIELD

The present invention relates to the use of scanning electron microscopes for investigating samples by way of cathodoluminescence spectroscopy. In particular, but not exclusively, it relates to investigation of samples by observing changes in the spectra and or images obtained with time-resolved scanning cathodoluminescence microscopes.

BACKGROUND

Conventionally, most commercial cathodoluminescence (CL) measurement solutions are third party add-ons to existing scanning electron microscopes (SEM). They consist of at least a light collection means and a light detector installed on scanning electron microscope. Applicant has disclosed a modern scanning cathodoluminescence microscopes in the above cited PCT Application. CL systems have been used with an aerial detector to collect the spectral distribution of the emitted CL (SP mode), or with an point detector to generate a panchromatic CL image of a scanned area of the sample (PC mode). In either of these modes, the resolution of the acquisition correlates to the size (diameter) and focus of the electron beam of the SEM, and the focusing of the CL collection optics.

The irradiation of a sample with an electron beam may cause (at least localized) change in certain properties of the sample. For example, Gelhausen et al., employed electron beam irradiation during cathodoluminescence to determine the chemical origin of the main optical emission lines in moderately and heavily Mg-doped GaN. See, Dissociation of H-related defect complexes in Mg-doped GaN, PHYSICAL REVIEW B 69, 125210 (2004). Similarly, EBIC (electron-beam-induced current) and CL were used to study the effects of electron injection causing increase of the minority carrier diffusion length in p-type GaN. See, Cathodoluminescence studies of the electron injection-induced effects in GaN, Chernyak et al., APPLIED PHYSICS LETTERS, Vol. 82, No. 21 (2003). These studies employed SP mode to investigate or confirm a suspected phenomenon in GaN samples injected with electrons. Specifically, the researchers relied on observed shift in intensity or frequency of specific CL emission and ascribed it to the researched phenomenon.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments and aspects of the present invention have been arrived at by considering the question: what characteristics and changes of the sample can be observed using time-resolved CL investigation, and what are the conditions necessary to enable the observations of these changes. The subject inventors have investigated changes in the CL spectra caused over time due to increase in radiation dose, and sought to provide quantitative analysis of the phenomenon. Moreover, the subject inventors have discovered that e-beam irradiation may also cause changes in CL panchromatic or color-filtered images (PC mode) with increased e-beam radiation. The subject inventors have discovered that certain features in the images may disappear with increased radiation and, at times reappear with further radiation. Thus, disclosed embodiments relate to both SP mode and PC mode investigations. However, to efficiently execute some of the disclosed embodiments, the operation of a standard CL microscope may need to be changed, as will be detailed below.

According to a disclosed aspect, methods are provided for using time-resolved CL spectra and/or images to study various characteristics and/or changes in the sample caused by electron beam. The characteristics and changes are investigated by observing changes in the optoelectronic properties of the sample caused by injection of electrons. These changes are discovered by observing changes in the spectra (SP mode) or images (PC mode) correlated with the dose delivered to the sample. In this disclosure, when a phenomenon appears in either a CL image or a CL spectra due to the e-beam irradiation, it is referred to as a change event.

In disclosed embodiments, various parameters of the electron beam are adjusted to enable precise control of the dose delivered to the sample and/or the layer of interest within the sample. For a new untested sample the beam is adjusted to deliver low dose with each pass and the CL is continuously collected. Also, the optical acquisition system is set up for very high acquisition speed, i.e., very short acquisition time per pixel. Thereafter the time-series spectra or images are processed to determine which doses reveal changes in the sample, i.e., a change event. Subsequent investigations are then performed by adjusting the parameters of the electron beam to deliver the doses that were observed to result in changes in the spectra or images, thus accelerating the observation of the events.

The disclosed embodiments are advantageous in that it enables discovering phenomenon that were previously unknown, and then provide a method for testing samples for these phenomenon in higher speed. Disclosed embodiments also include methods for performing CL acquisition without reading the data from the sensor's buffer until the full acquisition is complete. This process enables finer collection of data as the irradiation proceeds, since no data is lost due to interrogation of the sensor buffer.

Disclosed aspects include a method for investigating a sample by generating a time-series emission in a cathodoluminescence (CL) microscope having an electron beam and a light sensor, comprising: setting parameters of the electron beam to irradiate the sample at a first rate of dose; flushing a buffer of the light sensor; scanning the electron beam over an area of interest on the sample while collecting CL emission with the light sensor, while preventing any reading of the data from the buffer until the entire scanning has been completed; once the entire scanning has been completed, blanking the electron beam and interrogating the buffer to identify a first CL image; and, interrogating the buffer to fetch all remaining CL images and tagging all fetched CL images according to time sequence starting from the first CL image. The CL images may be panchromatic (i.e. integrating a large swath of the emitted CL spectrum) or color-filtered (i.e. selecting a precise portion of the aforementioned spectrum) cathodoluminescence images, or cathodoluminescence spectra images.

The step of collecting CL emission with the light sensor may be initiated prior to the start of scanning the electron beam. The method may include identifying change events wherein changes in the CL images of the sequence are visible, and determining a change dose corresponding to dose delivered to cause each change event. The method may also include setting parameters of the electron beam to irradiate the sample at a second rate of dose higher than the first rate; performing a second scan to irradiate a second sample with the change dose; and collecting CL emission with the light sensor to verify occurrence of change events. Also, the electron beam may be defocused to reduce the irradiation rate or dose rate and acquiring the CL images may be done at a rate of 50 ns-2 µs per pixel. Conversely, the electron imaging field of view, pixel density and scan speed may be changed to control the dose. A height map of the area of interest may be generated beforehand and the distance from light collection optics to the sample may be adjusted to be kept constant during the scanning of the electron beam according to the height map, or directly according to a height sensor probing the distance between the sample and the optical collection optics in real time.

Other disclosed aspects include a method for investigating a sample by generating a time-series emission in a cathodoluminescence (CL) microscope having an electron beam and a light sensor, comprising: performing a discovery scan of the sample wherein the electron beam delivers a first dose rate (irradiation rate) to the sample while collecting CL emission with the light sensor; generating a time-series of CL images collected during the discovery scan; identifying a change event in the time-series, wherein changes among several consecutive images are observable; determining a change dose corresponding to total dose delivered to the sample up to the occurrence of the change event; performing an inspection scan of a second sample using the change dose obtained from the discovery scan while collecting CL emission with the light sensor; and, generating a second time-series of CL images collected during the inspection scan. The CL images may comprise panchromatic cathodoluminescence images or cathodoluminescence spectra images and during the discovery scan and optionally during the inspection scan reading of data from the memory buffer of the light sensor is prevented until the discovery scan is completed. The memory buffer of the light sensor is flushed prior to initiating the discovery scan and prior to initiating the inspection scan. Also, CL image acquisition by the light sensor is initiated prior to initiating scanning of the electron beam for each of the discovery scan and the inspection scan. During the discovery scan collecting the CL emission with the light sensor by acquiring CL images at a first field of view and during the inspection scan acquiring CL images at a second field of view, equal or smaller than the first field of view.

The method may include generating a height map of the sample prior to performing the discovery scan and using the height map during the discovery scan to keep distance from the sample to a light collection objective constant. The height map may be generated using focus criteria of the light collection objective, or using a dedicated sensor calibrated on the latter criteria. The method may also include defocusing the electron beam.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

Other features and advantages of the invention will become apparent from the following description of non-limiting exemplary embodiments, with reference to the appended drawings, in which:

FIG. 2 is a schematic cross-sectional view of a portion of a sample, illustrating the distribution of energy from an e-beam inside the sample;

FIG. 3 is a flow chart of a sample inspection according to one embodiment;

FIG. 4 is a flow chart of a sample inspection according to another embodiment;

FIGS. 5A and 5B are plots of a CL spectra of a sample, showing change events caused by the e-beam irradiation, according to an embodiment.

FIGS. 6A and 6B are CL images of a sample, showing change events caused by the e-beam irradiation, while FIG. 6C illustrates the corresponding CL spectra, according to an embodiment.

FIG. 7 is a flow chart of a process for performing initial discovery process and using the results to perform inspection of a sample, according to an embodiment.

FIG. 8 is a chart showing the time evolution of some parameters in FIGS. 5A and 5B, further explaining the discovery process in spectral mode.

DETAILED DESCRIPTION

Figure 1:
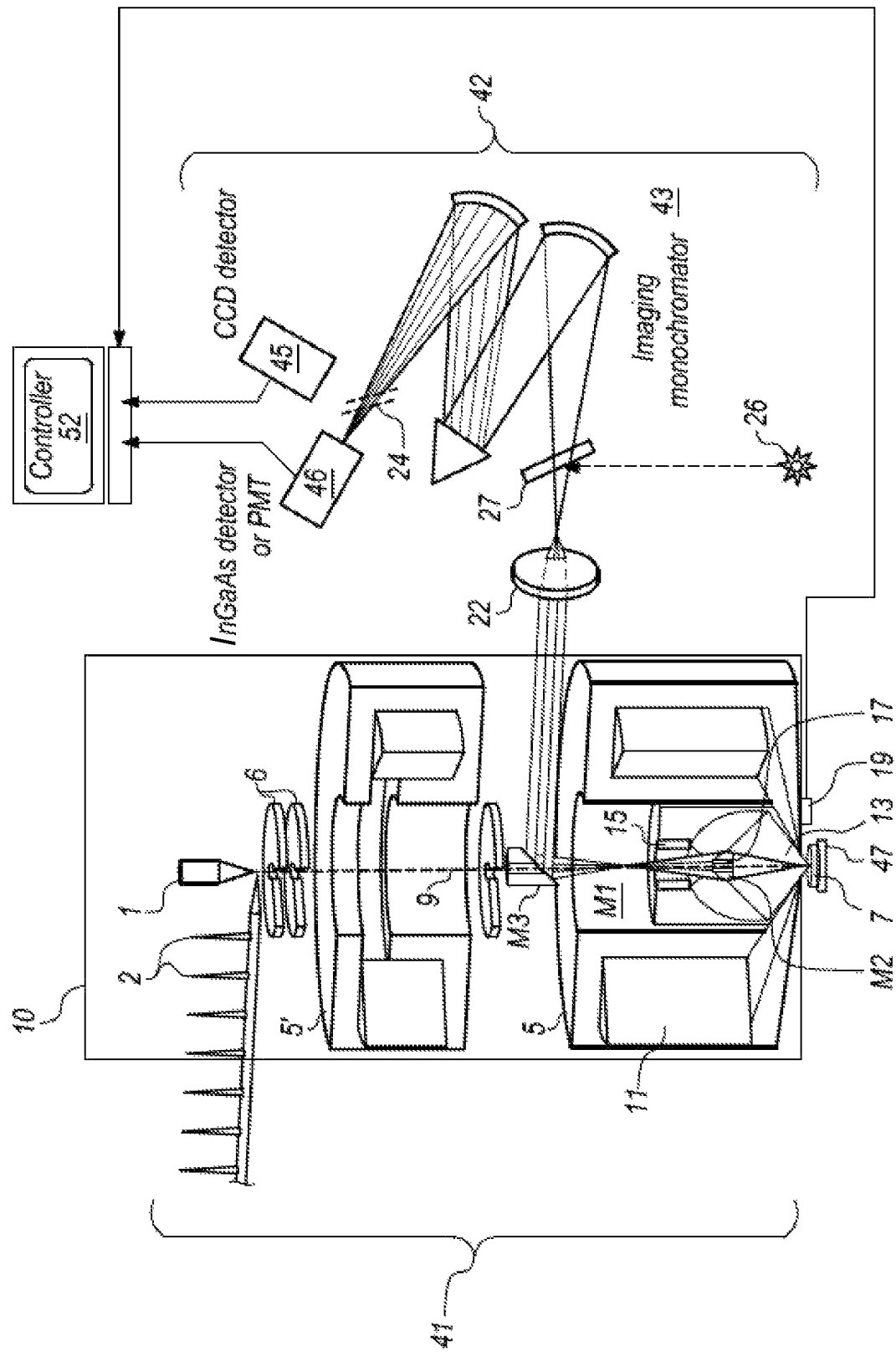
FIG. 1 is a cross-section of an integrated quantitative cathodoluminescence scanning electron microscope modified to implement time-resolved CL studies according to disclosed embodiments.

Some embodiments of the present invention are described below in more detail with reference to the attached figures. Identical functional and structural elements which appear in the different drawings are assigned the same reference numerals.

Embodiments of the inventive time-resolved cathodoluminescence examination of samples will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments, even if such are not explicitly described herein.

FIG. 1 illustrates relevant portions of a CL microscope wherein the CL collection optics is integrated with the electron beam column. It should be appreciated; however, that embodiments disclosed herein may be implemented in situations wherein a CL equipment has been included as an add-on tool onto a scanning electron microscope. What is desirable for maximizing the benefits of the disclosed embodiments are good control over the parameters of the electron beam (e.g., focus, current, beam width, etc.), good control over the CL collection optics (focus, sensitivity, sensor speed, etc.), and access to modifying the signal collection and image formation software and/or hardware. A more detailed description of the CL microscope is provided in the cited PCT/EP2020/063093, which is incorporated herein by reference, but some relevant description is provided herein for convenience together with modifications required for disclosed embodiments.

As illustrated in FIG. 1, the microscope generally includes an electron column 41 that is housed within vacuum enclosure 10, and optical (CL) imaging elements 42, which are in atmospheric environment. The integrated microscope shown in FIG. 1 can generate an electron beam image, a CL image using a point detector such as a photomultiplier tube (PMT) or an InGaAs diode array 46 (PC mode), or a CL spectrographic image using an array detector such as a CCD camera 45 or an InGaAs diode array 46 (SP mode). Incidentally, in FIG. 1, light source 26 may be replaced by a point detector (e.g., PMT) and used to generate the CL images instead of using detector 46. Therefore, element 26 in FIG. 1 may alternately represent a light source or a point detector. In this respect, it should be noted that the term point detector does not necessarily mean that the detector has a single light sensing element, but means that the output signal of the detector represents an integration of several emission energies from the sample.

Note that both the CCD camera and the point detector are indicated as usable for capturing CL spectra. Generally, a point detector is used to generate CL spectra, by spatially orienting the point detector with a slit so as to capture the desired wavelength of the wavelength dispersed emission. In the example illustrated in FIG. 1, the CCD camera may be used as a line detector by summing up all pixels in each column, and spatially orienting the CCD to capture multiple wavelengths of the dispersed emission simultaneously, each added column representing a single or a defined bandwidth of the total spectrum.

The imaged CL emissions can be correlated to the structure and quality of the sample's material at the nano-scale, to reveal material stress, impurities, crystallographic, and subsurface defects that are not visible using other imaging modes. Importantly, while generally the CL imaging is considered as a non-destructive method of inspecting a sample, embodiments disclosed herein investigate changes in the characteristic of the sample that are caused by the irradiation of the electron beam. Thus, while the sample may remain fully operational after the CL imaging, the injection of electrons by the SEM causes changes in the optoelectronic properties of the sample.

The electron column includes an electron source 1, such as a thermionic or field emission source, that emits electrons. The emitted electrons are made into an electron beam 9 by the various particle-optics elements, such as electromagnetic condenser lens 5', electromagnetic objective lens 5, and aperture disks (sometimes referred to as stops) 6. Note that any of the aperture disks 6 may function as an electrostatic lens by application of potential thereto. In FIG. 1, pulses 2 indicate that in this particular example the electron emission from the source 1 may be done in pulses, but this is not necessarily so. For example, emission may be done continuously or shutters may be used to generate intermittent emission. Regardless of operational method of the source, for improved results it is desirable that a good method for blocking the beam (e.g., beam blocker, beam deflection, etc.) is provided.

The magnetic field generated by the magnetic lens forms a converging electron beam 9 which can be focused and scanned on to the surface of the sample 7. In this example, the electron beam 9, which is generated by the electron emitter 1, propagates from the top of the figure downwards. The electron beam span may be modified by a condenser arrangement, such as a lens 5', so that it can either diverge, be collimated or converge. The condenser means may be placed below the electron emitter. The resolution of the electron image is directly related to the spot size of the beam on the sample, so that conventionally efforts are made to properly focus the electron beam on the sample. The position, and more specifically the height above the sample, of the focal plane can be adjusted by varying the intensity of the magnetic field flowing through the electromagnetic objective lens 5.

As can be seen in FIG. 1, the reflective objective within the electromagnetic objective 5 comprises a first mirror M1, also referred to as the primary mirror, which in this example is spherical and concave, and a second mirror M2 also referred to as the secondary mirror, which in this example is spherical and convex. The diameter of the first mirror M1 is larger than the diameter of the second mirror M2. The first mirror M1 is located above the second mirror M2 and is arranged to reflect the light coming from the sample as a result of the electron beam 9 hitting the surface of the sample 7, and to direct the light towards the second mirror M2 placed between the sample and the first mirror M1. The second mirror M2 is arranged to redirect the light along the optical axis of the electromagnetic objective, and a third mirror, M3, which in this example is planar, is arranged to redirect the light beam 4 towards an output. In this example the third mirror M3 has a 45° angle with respect to the electron beam 9 axis and is used to redirect the light out of the vacuum enclosure 10. All the three mirrors M1, M2 and M3 have an aperture or opening along the electron beam path so that the electron beam is not obstructed.

The microscope shown in FIG. 1, also comprises a first deflector 17 and a second deflector 15. Each deflector may comprise for example four longitudinal electrical conductors (quadrupole), also referred to as electrodes. They may also comprise four magnetic coils (magnetic deflector). However, the number of electrodes or magnetic poles could also be different from four. For example, there might be eight electrodes or magnetic poles (octupole) instead of four, so that the astigmatism of the electron beam could be corrected as well. In this case four of the electrodes or magnetic poles are called stigmators used to correct the astigmatism.

The electron beam characteristics can be affected by the current applied to the source, the acceleration voltage, the electromagnetic and electrostatic elements along its path, and the working distance to the sample. For embodiments disclosed herein, it is important to implement good control over the dose, and especially the rate (dose per time), delivered to the sample by the electron beam, which includes the electron energy of the beam, the beam current, and the spot size. Note that the deflectors are used to deviate the trajectory of the electron beam so that it can be scanned over the surface of the sample 7, but do not control the characteristics of the beam itself. However, the scan parameters, e.g., pixel density and field of view when rastering the beam over the area of interest is used to control the dose delivered over the sample's surface, provided the dwell time per pixel is low enough.

To accurately calculate the delivered dose, it is beneficial to consider that the energy distribution is a pear shape, as illustrated in FIG. 2. FIG. 2 illustrates a cross-section of a part of a sample having three distinct layers, e.g., each made of different material. Depending on the control signal applied to the electron column, the beam can have different spot size on the sample and be focused into different depths in the sample. Specifically, the primary beam accelerating voltage has to be high enough that a non-negligible portion of the electrons actually reach the region or layer of interest if for instance it is buried, as shown by layers B and C. However, regardless of the accelerating voltage, the actual distribution of the energy is approximated by the pear shape shown as 9'. Thus, depending on the layer of interest, the actual dose delivered can be approximated by considering the "slice" of the pear that is deposited within that layer. Note also that the spatial width of the energy distribution is larger than the spot size of the beam on the surface of the sample.

Generally, in order to achieve high resolution the electron beam is focused as tightly as possible, down to a sub-nanometer size. However, in certain embodiments, as will be described in more details below, in order to reduce the dose delivered per scan, the electron beam is actually defocused to diameter or spot size of, e.g., between 1-10 micrometers, so that the energy is distributed over a larger area, thus reducing the dose per pixel. Conversely, in other embodiments the electron beam is focused tightly, but it is rastered rapidly over the Field of View (FOV). For example, increasing the scan speed, i.e., reducing dwell time per pixel (from 20 μs to 100 ns for instance), and reducing the number of pixels in the FOV (from 2048 to 128 for instance) allows to either get a quality image at each frame taken for the image series mode, or have a statistically relevant number of frames for the spectra acquisition. Ideally for the spectra acquisition, several frames of the FOV should be taken for each spectrum acquired.

Returning to FIG. 1, the light reflected by mirror M3 is focused by lens 22 onto an imaging monochromator 43. In this example, two imagers are provided, a CCD camera 45 or InGaAs diode array 46—InGaAs for the SP mode and a point detector such as a PMT 46—PMT, 26, for the PC mode. In other embodiments, the CCD camera 45 may also be used for PC mode by adding all pixels in a column to a single pixel, thereby forming a linear detector. If mirror 24 is a half mirror, then both imagers can be operated simultaneously. Conversely, mirror 24 may be a flip mirror, enabling one imager at a time. With this arrangement, detector 46—PMT can be used to detect light intensity of a specified wavelength, while CCD camera 45 or InGaAs diode array 46—InGaAs may be used to detect light intensity at several wavelengths simultaneously, especially when operated in a linear mode.

In the embodiment of FIG. 1, an electron detector 19 is provided, to be able to detect secondary electrons emitted from the sample, or back scattered electrons reflected by the sample. The signal of this detector can be used to generate a scanning electron microscope (SEM) image. Also, in the embodiment of FIG. 1, the sample holder 47 is in the form of a cryogenic stage, which keeps the sample at low temperatures such that the CL emission is much more efficient because many non-radiative pathways become impossible below a certain threshold. It also improves spectral resolution by reducing the "thermal jiggling" in each emitted photon.

Generally in SP mode, CCD detector 45 or InGaAs diode array 46—InGaAs incorporate a buffer and as each image is formed it is stored in an internal buffer. The controller 52 calls each image from the buffer and displays the latest image on the monitor. In this configuration, calling several images in a row does not guarantee that strictly subsequent images will be retrieved, as the time overhead incurred by the retrieval of an image can exceed the acquisition time of the next few images, such that images that could have been acquired during the overhead time are skipped and will not be available. However, according to disclosed embodiments, it is desired to form new image for each minute change in the sample caused by the irradiation of the electron beam. Accordingly, in disclosed embodiments the operation of the controller is modified such that it does not call the images from the CCD detector 45 until all of the images have been formed and the scanning is completed. Stated conversely, any interrogation of the buffer is prevented during the e-beam scanning of the sample, therefore ensuring that every single image acquired is intact in the buffer and can be linked to an acquisition order by the controller 52. In the case of PC mode e.g. using a PMT 46—PMT or 26, the controller 52 itself contains a buffer saving each PC image, as point detectors are treated using different channels than array detectors. In this case the same process is applied to the buffer contained in the controller 52. In a further embodiment, the two schemes can be added in order to obtain the same result using an array detector in PC mode.

FIG. 3 is a flow chart illustrating the general process for acquiring the CL spectra and CL images to identify change events. This general process may be employed both for samples wherein correlation of events to delivered dose is unknown (discovery process) and for samples wherein certain amount of dose is expected to result in observable change event (inspection process). An important difference between operation of the discovery and inspection processes is that when performing discovery, it is important to capture each minute increase in dose, so the dose delivery should be minimised at each pixel acquisition. Conversely, for inspection process, since the amount of dose required to generate an observable event is known before hand, the set-up is arranged to image directly the known dose amount. Consequently, the inspection process is much faster than the discovery process, although the CL image evolution obtained from the discovery process may form important testing results as well.

The process of FIG. 3 begins by setting the appropriate acquisition parameters. For a discovery process, in step 300 the parameters of the electron beam, such as accelerating voltage, beam current, dwell time, etc., are set so that the dose delivered by the electron beam for each pixel at each dwell time is minimized so as to enable detection of every small change event. This is done by considering the distribution of the energy and the position of the layer investigated, as discussed with respect to FIG. 2. If desired, the delivered dose can be further minimized by defocusing the e-beam to generate a spot having diameter of 0.1-10 microns. Similarly, in step 305 the parameters of the CL acquisition system (including the camera 45 and PMT 46 parameters) are set. At this step the field of view may be reduced if desired. It should be noted that there is an inverse relationship between the beam focus/spot size and the field of view, i.e., defocusing the beam reduces the dose delivered while reducing the field of view increases the dose delivered.

As noted previously, conventionally the buffers of the camera 45 and PMT 46 would have data from prior acquisition—regardless if such data was previously called by the controller. Generally, the data remains in the buffer until it is overridden by acquisition when the buffer is full. Conversely, in this embodiment in step 310 the buffers are flushed of all data in preparation for each acquisition. In order to record all CL emissions, at 315 the controller is programmed to not call any data from the sensor (camera 45 and/or PMT 46) until the entire acquisition run is completed. The aim is to keeping communications with the sensor to its bare minimum to ensure the time series can be reconstructed in the proper time sequence, since having multiple calls to the buffer leads to losing track of the timing of each individual image or spectrum. For example, using the straightforward method based on the regular SDK commands discards a few spectra recorded by the sensor in each acquisition due to the communication with the controller, reading and forwarding the data, whereas the method of this embodiment discards no spectrum at all. So, while the conventional approach is advantageous in that images or spectra are available immediately during the acquisition, in the disclosed method seeing the image immediately is relinquished in favor of not losing any CL emission data and therefore keeping a complete control over the image/dose relationship. The images may be displayed only once the entire acquisition is completed.

In step 315 continuous acquisition is performed without accessing the data of the sensor. Rather, the data is collected in the buffer of the sensor. Once the entire acquisition is completed, i.e., the area of interest has been scan the number of predetermine scans, in step 320 the buffer is interrogated to fetch the data and the data is tagged according to the timing of its acquisition. Since the data is tagged, any image or spectra obtained at any given irradiation time can be displayed on the monitor. Moreover, the entire time series can be serially displayed or investigated to identify change events.

Change events that may be observable in the time-series images and/or spectra may include changes caused by activation of the material by the electron beam itself (e.g., a change of its properties induced by irradiation by the e-beam, either by charge accumulation in the material, ionization of dopants in the material, or a physical effect such as kicking interstitial atoms back into place, or breaking down chemical complexes such as Mg:H complexes in Gallium Nitride). Other change events may relate to creation of a dynamic equilibrium between the charge carriers in the sample and the carriers injected by the e-beam. An example of this effect would be carrier-induced band bending or the relative saturation of a particular emissive state, lowering the relative emission from its transition compared to other transitions. The embodiments disclosed herein provide methods for observing static or dynamic changes in the optoelectronic properties of the materials and the time-evolution thereof. That is, some features appear or disappear, over time, in SP and/or PC mode, due to changes in optoelectronic properties upon accumulated charged particles irradiation.

Since according to disclosed embodiments it is desired to deliver small increments of dose when investigating change events, it would also be beneficial to have control of when the beam actually irradiates the sample. Also, as will be described further below, in disclosed embodiments it is also beneficial to start image acquisition prior to initiating the e-beam irradiation on the sample. To support these objectives, a good beam blanking should be implemented. Blanking can be achieved by either the electrostatic or electromagnetic deflectors that are already available in the electron microscope, or using a dedicated beam blanker added to the electron microscope's column.

Also, the distance between the optical collection optics and the sample needs to be maintained to a high degree of accuracy during the measurement to ensure the absence of artifacts linked to an acquisition out of the collection optics' focus. This can be done by several ways, for instance by creating a height map of the area to be scanned prior to the measurement using the optical focus as a criterion, or using a distance measurement sensor, capacitive or otherwise. Thus, during the image acquisition the sample of the light collection optics or the sample can be moved so as to maintain constant distance, especially when the sample's surface has curvature or uneven structure in the area of interest.

Taking into account the above considerations, a method for acquiring a time-dependent CL images or spectra is provided, as illustrated in the flow chart of FIG. 4. As an initial step, optionally a height map is created, as shown by dashed step 400. Then, similar to the embodiment of FIG. 3, in step 401 the e-beam and the optical collection parameters are set up to provide the required dose increment for each pixel at each scan. At step 402 the e-beam is blanked, e.g., by deflecting it to a faraday cup or any other sufficiently fast beam blanking method. At step 404 the sample is moved in a position such that the area of choice for the measurement is exposed to the charged particles beam. As noted previously, the distance between the sample and the optical collection optics is an important parameter to keep focus of the CL collection optics, and at step 406 the height of the sample is adjusted to achieve proper focus. This height may be changed during the scan as needed for an uneven sample according to the height map generated in step 400.

Prior to starting the acquisition, the sensors buffers are flushed at 410. This step could have been performed at any time prior to step 412, but it must be ensured that the buffers are totally empty prior to the start of the CL acquisition. At step 412 the sensors acquisition is initiated, while blocking any interrogation requesting data from the buffer. Then at step 414 the beam is unblanked and scanning of the area of interest is initiated. As demonstrated in FIG. 4, it is preferred to initiate the CL acquisition prior to initiating e-beam scanning. This ensures that the CL acquisition captures the initiation of the e-beam scanning. At step 416 the entire scanning and CL acquisition process is run, without obtaining any data from the sensors' buffers. That is, all of the captured CL data is maintained only in the buffers.

When the full test is completed, at step 418 the e-beam is blanked again. At this point the data can be fetched from the sensors. At step 420 it is determined which data of the buffer corresponds to the first captured CL image. Using this data, the remaining data is tagged to generate a time series from the data of the buffer at step 425.

Generally, cathodoluminescence emission is rather faint. Therefore, in order to obtain a good CL detection it is conventional in the art to use high e-beam current, so as to enhance the CL emission. However, unexpectedly the subject inventors have discovered that when the e-beam current is reduced so as to have very low dose rate delivered to the sample, previously unobserved change events appear in the acquired CL signal. Therefore, at least for the initial investigation scan, also referred to as a discovery scan, disclosed embodiments aim to minimize the dose delivered per time by, e.g. setting low e-beam current or by defining a large field of view so that the dose delivered per unit area at constant pixel density is low. It was also unexpectedly discovered that by implementing fast acquisition time, e.g., 50 ns-2 µs, and especially 100 ns-200 ns, per pixel, it unlocked an ability to see change events that were previously not observable. Also, to achieve such acquisition speeds and generate successive images of small incremental doses, it is beneficial to prevent any read calls to the sensor buffer until the entire scan is completed.

FIGS. 5A and 5B illustrate spectra plots of a sample wherein FIG. 5A shows three peaks at three different energies taken at a time to prior to the sample being irradiated sufficiently to show a change event, and FIG. 5B shows the effect on the three peaks at a time $t_N$ after sufficient dose of radiation has been applied to the sample. Note that in this respect, $t_0$ does not denote the time of initiating the e-beam scanning, but rather it denotes an arbitrary time prior to time $t_N$. An example of $t_0$ and $t_N$ determination is shown in FIG. 8, where $t_N$ is selected as the time point where the values for peak 1 and peak 2 have reached a plateau after the transient period $t_T$, while the $t_0$ is selected as the time point prior to the initiation of the transient period. As can be seen from FIGS. 5A and 5B, the intensity of peak 1 has increased, although the full-width half maximum (dash-dot lines FWHM) has stayed relatively the same. The amplitude of peak 2 has decreased drastically, while the curve of peak 3 has not changed at all. Accordingly, disclosed embodiments include quantitative analysis of the various peaks of the time-series spectra by investigating amplitude change over time, especially during the transient period $t_T$, e.g., the rate of change within the transient period, peak wavelength (energy) shift over time and within the transient period, peak full width at half maximum change over time, or the speed at which these parameters change over time (i.e., rate of parameters change relative to accumulation of irradiation dose, as in the times before $t_N$ in FIG. 8).

By investigating change events in CL spectra that cause wavelength or energy shift in certain peaks, change in amplitude of certain peaks, and/or changes in FWHM of certain peaks, and the rates of changes, it is possible to study dopant concentration is certain samples. Also, charge accumulation at the interface between two layers of different materials may cause a peak to appear, then disappear over time due to accumulation of charged electrons in the interface, in which case dose control becomes even more crucial to determine the measurement window.

As noted, the subject inventors also discovered that CL images (PC mode) may also change over time with accumulated e-beam radiation. For example, while performing features counting in InGaN/GaN multi quantum wells, certain features may appear at the early stages of irradiation, then fade away, to finally return as the irradiation dose passes a certain threshold. FIGS. 6A and 6B illustrate CL images selected from two different times in a time-series PC mode CL imaging, showing two types of defects in the sample. The features such as the ones displayed can appear either as darker or brighter spots on a panchromatic cathodoluminescence image. The type 2 defects have disappeared from the image of FIG. 6B, while the type 1 defects are still visible. FIG. 6C illustrate the spectra at these two times (solid line for $t_0$ and dash for $t_N$), showing no noticeable change. Thus, it is illustrated that changes in spectra over time does not necessarily indicates a corresponding change in CL images, and a change in the CL images does not necessarily indicate a change in the spectra.

By obtaining a full time-series CL images using low dose increments, quantitative analysis can be obtained by correlating the appearance and/or disappearance of certain features in images per the recorded applied dose up to the observed change event. Once these parameters are known, the information can be used to inspect a different site on the sample or a different sample. For example, it allows to differentiate between defect types: by observing that defects type 2 disappear from the CL images after a recorded dose has been applied, on a second inspection seeking to count the number of type 1 defects, the recorded dose can be applied immediately so as to obtain an image having only type 1 defects, thereby making it easier to count. Alternatively, the subtraction of the image at $t_0$ from the image at time $t_N$ informs the user on the density and location of type 2 defects. Also, the evolution of the appearance of the defect spot in the image can signify a particular type of defect, differentiating from defects who's spot appearance does not change over time.

FIG. 7 is a flow chart illustrating a process that may be executed while utilizing the processes of FIGS. 3 and/or 4. At 700 the e-beam and CL acquisition systems are set for performing time-resolved CL imaging at a first irradiation dose rate, which is a slow irradiation dose rate. As explained above, this can be done by, e.g., defocusing the e-beam, performing fast scan with large field of view generating short dwell time per pixel, or simply decreasing probe current. Also, the system can be set up for preventing reading of the data from the sensor until the entire test is completed, etc. At 705 the scanning is performed for a discovery process and the CL time-series is generated using SP mode, PC mode, or both. Since the dose rate was set to low, each image of the CL time series corresponds to a small increment in the dose delivered to the sample of the corresponding pixel. At step 710 the obtained series is analysed by any of the method disclosed herein to identify change events and to determine change events and specific changes in the CL images and the rate of change. Additionally, the specific dose needed to reach any change event, e.g., the dose delivered for reaching time $t_0$ and the dose needed to reach time $t_N$, is recorded as a change event dose. In 715 the parameters of the e-beam and CL system are changed using the change event doses obtained in step 710. For example, the e-beam is refocused and/or the field of view is reduced, so that the e-beam has to raster a smaller area. Then at 720 a second test is performed at a different site on the sample or on another sample. This time the system can deliver the change event dose required for observing the change events at a much faster rate. Consequently, any subsequent scan using the knowledge of when change events occur and the required doses would be much faster than the discovery scan. This is true especially for the situation when the inspection scan is done on a reduced field of view.

Stating it differently, the discovery scan is performed in a manner enabling collection of many data points indicating each minute increment in the delivered dose per pixel. Conversely, during the inspection scan, the operator already knows the general shape of the curves per delivered dose, so that the inspection scan is performed in a manner that generates fewer data points and the operator can simply use the smaller number of data points to determine whether these points aligned with the expected curve obtained from the discovery scan. Thus, according to disclosed embodiments, a method is provided for investigating a sample by generating a time-series emission in a cathodoluminescence (CL) microscope having an electron beam and a light sensor, comprising: performing a discovery scan of the sample wherein the electron beam scans the sample while collecting CL emission with the light sensor and generating a first set of data points; generating a first time-series of CL images using the first set of data points; identifying transient period in the first time-series, wherein changes in multiple consecutive images are observable; performing an inspection scan of a second sample while collecting CL emission and generating a second set of data points, the second set having fewer data points than the first set; generating a second time-series of CL images using the second set of data points; determining parameters of changes observable during the transient period in the second time-series of CL images. The parameters may include shift in peak wavelength, shift in peak amplitude, rate of shift in peak wavelength and/or amplitude. The second set of data points may be collected from an area of the sample that is smaller than the area used to obtain the first set of data points. The smaller area may be obtained by setting a smaller field of view for the inspection scan than the field of view set for the discovery scan.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

The invention claimed is:

1. A method for investigating samples by generating a time-series emission in a cathodoluminescence (CL) microscope having an electron beam and a light sensor, comprising:
   performing a discovery scan of an area in a first site of a first sample wherein the electron beam delivers a first dose rate to the sample while collecting CL emission with the light sensor;
   generating a time-series of CL images collected during the discovery scan;
   identifying a change event in the time-series, wherein a change among multiple consecutive images is observable;
   determining a change dose corresponding to total dose delivered to the sample up to the occurrence of the change event;
   performing an inspection scan of a second site of the first sample or scan of a second sample using the change dose obtained from the discovery scan while collecting CL emission with the light sensor; and,
   generating a second time-series of CL images collected during the inspection scan.

2. The method of claim 1, wherein during the discovery scan reading of data from a buffer of the light sensor is prevented until the discovery scan is completed.

3. The method of claim 1, wherein the CL images comprise panchromatic or color-filtered cathodoluminescence images, or cathodoluminescence spectra images.

4. The method of claim 1, further comprising flushing a buffer of the light sensor prior to initiating the discovery scan and prior to initiating the inspection scan.

5. The method of claim 4, further comprising initiating CL image acquisition by the light sensor prior to initiating scanning of the electron beam for each of the discovery scan and the inspection scan.

6. The method of claim 1, further comprising determining a focus height for CL collection optics to the sample prior to performing the discovery scan and using a height sensor during the discovery scan to change elevation of the sample to keep the focus height constant.

7. The method of claim 1 wherein:
   performing the discovery scan comprises generating a first set of data points;
   generating the first time-series of CL images uses the first set of data points;
   identifying a change event comprises identifying a transient period in the time-series, wherein changes in multiple consecutive images are observable;
   performing the inspection scan comprises generating a second set of data points, the second set having fewer data points than the first set;
   generating the second time-series of CL images uses the second set of data points; and,
   determining parameters of changes observable during a transient period in the second time-series of CL images.

8. The method of claim 7, wherein the parameters comprise at least one of: shift in peak wavelength, shift in peak amplitude, rate of shift in peak wavelength, rate of shift in peak amplitude.

9. The method of claim 7, wherein the second set of data points is collected from an area of the second site or the second sample that is smaller than the area used to obtain the first set of data points.

10. The method of claim 1, further comprising setting parameters of the electron beam to irradiate the sample at the change dose by reducing a field of view or changing a probe current.

11. The method of claim 1, wherein performing a discovery scan comprises:
    setting parameters of the electron beam to irradiate the sample at the first dose rate;
    flushing a buffer of the light sensor;
    scanning the electron beam over an area of interest on the sample while collecting CL emission with the light sensor, while preventing any reading of the data from the buffer until the entire scanning has been completed;
    once the entire scanning has been completed, blanking the electron beam and interrogating the buffer to identify a first CL image;
    interrogating the buffer to fetch all remaining CL images and tagging all fetched CL images according to time sequence starting from the first CL image, to thereby generate the time-series of CL images.

12. The method of claim 11, wherein the CL images comprise cathodoluminescence spectra.

13. The method of claim 12, wherein setting parameters of the electron beam comprises defocusing the electron beam, changing its probe current or changing the electron image field of view.

14. The method of claim 11, wherein collecting CL emission with the light sensor comprises acquiring CL images at a rate of 50 ns-2 µs per pixel.

15. The method of claim 11, wherein the CL images comprise panchromatic or color-filtered cathodoluminescence images.

16. The method of claim 11, wherein the step of collecting CL emission with the light sensor is initiated prior to the start of scanning the electron beam.

17. The method of claim 11, wherein setting parameters of the electron beam comprises forming a beam having spot size diameter of between 0.01-10 micrometers.

18. The method of claim 11, further comprising generating a height map of the area of interest and varying the distance from light collection optics to the sample during the scanning of the electron beam according to the height map.

* * * * *